United States Patent
Farnworth et al.

[11] Patent Number: 6,107,119
[45] Date of Patent: Aug. 22, 2000

[54] METHOD FOR FABRICATING SEMICONDUCTOR COMPONENTS

[75] Inventors: Warren M. Farnworth, Nampa; Alan G. Wood, Boise, both of Id.

[73] Assignee: Micron Technology, Inc., Boise, Id.

[21] Appl. No.: 09/110,232

[22] Filed: Jul. 6, 1998

[51] Int. Cl.$^7$ .......................... H01L 21/44; H01L 21/48; H01L 21/50
[52] U.S. Cl. .......................... 438/106; 438/113; 438/612
[58] Field of Search .................................... 438/106, 113, 438/612

[56] References Cited

U.S. PATENT DOCUMENTS

| | | | |
|---|---|---|---|
| 4,527,041 | 7/1985 | Kai . | |
| 5,338,645 | 8/1994 | Hendersen et al. | 430/311 |
| 5,426,072 | 6/1995 | Finnila . | |
| 5,528,080 | 6/1996 | Goldstein . | |
| 5,634,267 | 6/1997 | Farnworth et al. | 29/840 |
| 5,639,695 | 6/1997 | Jones et al. . | |
| 5,663,593 | 9/1997 | Mostafazadeh et al. | 257/666 |
| 5,666,722 | 9/1997 | Tamm et al. | 29/847 |
| 5,686,317 | 11/1997 | Akram et al. | 437/8 |
| 5,724,727 | 3/1998 | Chopra et al. | 29/832 |
| 5,741,726 | 4/1998 | Barber | 437/216 |
| 5,750,417 | 5/1998 | Nellissen . | |
| 5,931,685 | 8/1999 | Hembree et al. . | |
| 5,952,840 | 9/1999 | Farnworth et al. . | |
| 6,013,948 | 1/2000 | Akram et al. . | |

OTHER PUBLICATIONS

Anthony, T. R., "Forming electrical interconnections through semiconductor wafers", J. Appl. Phys., Aug. 1981, pp. 5340–5349.

Primary Examiner—Richard Booth
Assistant Examiner—Josetta Jones
Attorney, Agent, or Firm—Stephen A. Gratton

[57] ABSTRACT

A method for fabricating semiconductor components such as printed circuit boards, multi chip modules, chip scale packages, and test carriers is provided. The method includes providing a substrate having a blanket deposited conductive layer thereon. Using a laser machining process, grooves are formed in the conductive layer to define patterns of conductors on the substrate. The conductors can be formed with a desired size and spacing, and can include features such as bond pads, conductive vias, and external ball contacts. In addition, selected conductors can be configured as co-planar ground or voltage traces, for adjusting impedance values in other conductors configured as signal traces.

24 Claims, 6 Drawing Sheets

METHOD FOR FABRICATING SEMICONDUCTOR COMPONENTS

FIELD OF THE INVENTION

This invention relates generally semiconductor manufacture and particularly to an improved method for fabricating semiconductor components, and to improved semiconductor components and electronic assemblies fabricated using the method.

BACKGROUND OF THE INVENTION

Semiconductor components, such as chip scale packages (CSP), ball grid array (BGA) substrates, interconnects, test carriers, multi chip modules (MCM) and printed circuit boards (PCB), often include patterns of conductors. Typically, the conductors are formed using a conventional metallization process, such as blanket depositing, photopatterning and then etching a metal layer. In addition, conductive vias can be formed to electrically connect the conductors to contacts, or to other patterns of conductors, located on different surfaces of the component. Typically, the conductive vias can be formed by etching or punching holes, and then filling the holes with a conductive metal, using an electroless or electrolytic deposition process.

As semiconductor components become smaller and more complex, conventional processes sometimes cannot be employed to form the conductors and conductive vias. In particular the required size, spacing and shape of the conductors and vias cannot always be achieved using conventional processes. In addition, conventional processes, such as wet etching, are performed using environmentally hazardous materials and produce toxic waste.

Accordingly, there is a need in the art for improved processes for fabricating semiconductor components with smaller and denser patterns of conductors and conductive vias. In addition, improved processes that can be performed without the use of environmentally hazardous materials are needed.

SUMMARY OF THE INVENTION

In accordance with the present invention, an improved method for fabricating semiconductor components is provided. Also provided are improved components and electronic assemblies fabricated using the method.

Initially, a substrate with a blanket deposited conductive layer is provided. Depending on the application the substrate can comprise plastic, glass filled resin, silicon, or ceramic. Preferably, the conductive layer comprises a highly conductive metal, such as foil adhesively bonded to the substrate, or a thin film formed using a deposition process such as CVD.

Using a laser machining process, a pattern of conductors is formed on the substrate by ablating portions of the conductive layer to form grooves. Each conductor is defined by a groove on each side. The conductors can be made extremely small, closely spaced, and with precise dimensional tolerances due to the accuracy of the laser machining process. In addition, some of the conductors can be configured as signal traces, and others as co-planar ground, or voltage traces, for adjusting impedance values of the signal traces.

A laser system for performing the method includes a laser, a computer controller for controlling the laser, and an X-Y table for moving the substrate to produce the required pattern of grooves.

The method can also include laser machining, etching, or punching holes in the substrate, and then depositing a conductive material in the holes to form conductive vias. The conductive vias can be used to electrically connect the conductors to external contacts on the substrate. The conductive material for the conductive vias can comprise an electroless or electrolytically deposited metal, or a conductive polymer.

A variety of semiconductor components can be fabricated using the method of the invention. In a first embodiment a substrate with laser machined conductors is formed, and used to form printed circuit boards, and multi chip modules. In this embodiment one or more semiconductor dice can be wire bonded, or flip chip mounted, to the laser machined conductors on the substrate.

In an alternate embodiment, a BGA substrate having laser machined conductors can be used to form a chip scale package. The BGA substrate includes conductive vias in electrical communication with the laser machined conductors, and an array of ball contacts formed on the substrate in electrical communication with the conductive vias. The chip scale package includes the BGA substrate, a semiconductor die bonded to the conductors on the BGA substrate, and an encapsulant covering the die.

In another alternate embodiment, laser machined conductors are formed on a base of a test carrier configured to package semiconductor components, such as bare dice, and chip scale packages, for testing. The test carrier includes the base, an interconnect for electrically contacting a component under test, and a force applying mechanism for biasing the component under test against the interconnect. The interconnect is configured for bonding to the laser machined conductors on the base. In addition, external contacts on the base are formed in a ball grid array, and electrically connected to the pattern of conductors using conductive vias in the base.

DETAILED DESCRIPTION OF THE PREFERRED EMBODIMENTS

Figure 1:
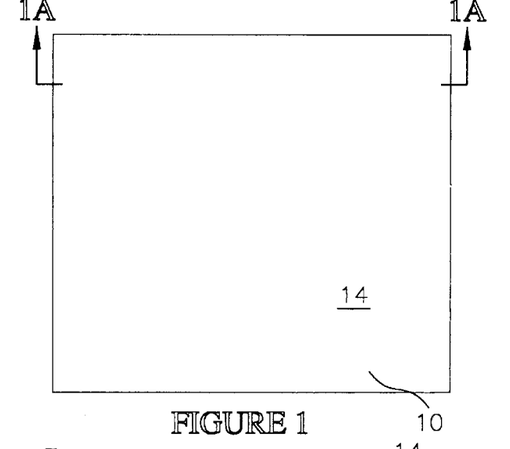
FIG. 1 is a plan view of a substrate prior to performing the method of the invention.
Figure 1A:
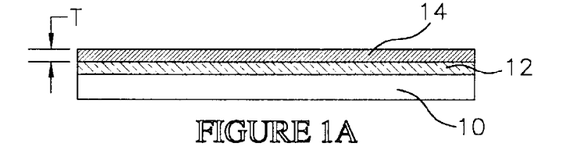
FIG. 1A is a cross sectional view taken along section line 1A—1A of FIG. 1.
Figure 2:
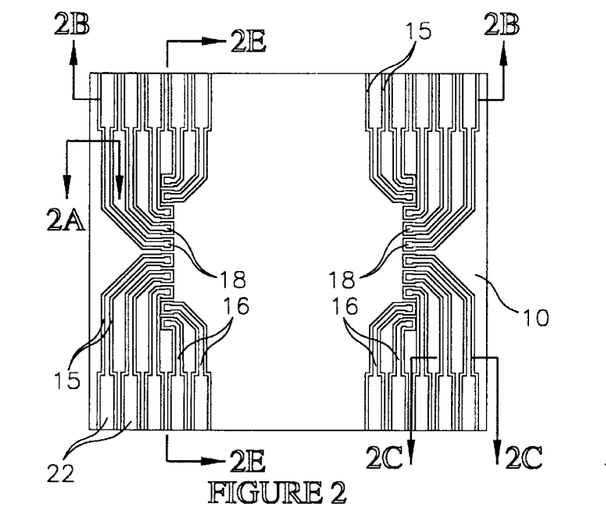
FIG. 2 is a plan view of the substrate following formation of conductors in accordance with the method of the invention.

FIGS. 1 and 2 illustrate steps in the method of the invention. Initially, as shown in FIGS. 1 and 1A, a substrate 10 comprising an insulating layer 12, and a blanket deposited conductive layer 14 can be provided.

Suitable materials for the substrate 10 include glass filled resins, such as FR-4, and plastics, such as polyetherimide (PEI) and polyphenyl sulfide (PPS). Another suitable material for the substrate 10 is silicon in the form of monocrystalline silicon, silicon-on-glass, or silicon-on-sapphire. Yet another suitable material for the substrate 10 is ceramic in laminated or unitary form. Also, for some applications the substrate 10 can comprise metal, germanium, or gallium arsenide.

Suitable materials for the conductive layer 14 include copper, aluminum, titanium, nickel, iridium, gold, tungsten, silver, platinum, palladium, tantalum, molybdenum or alloys of these metals. In addition, the conductive layer 14 can comprise an adhesively bonded foil, or alternately a thin film layer formed using a deposition process, such as sputtering or CVD. Still further, the conductive layer 14 can comprise a bi-metal stack, such as an adhesion layer, and a non-oxidizing outer layer. A representative thickness T for the conductive layer 14 can be from about 1 $\mu$m to 20 $\mu$m or more.

Suitable materials for the insulating layer 12 include polymers, oxides and nitrides. For example, the insulating layer 12 can comprise a polymer, such as polyimide, silicone or epoxy, which attaches the conductive layer 14 to the substrate 10. As another example, with the substrate 10 comprising silicon, the insulating layer 12 can comprise $SiO_2$ formed using a deposition or oxidation process. For some applications, the insulating layer 12 can be omitted, and the conductive layer 14 formed directly on the substrate 10. For example, with the substrate 10 comprising glass filled resin, plastic, or ceramic, the conductive layer 14 can be formed directly on the substrate 10.

Figure 2A:
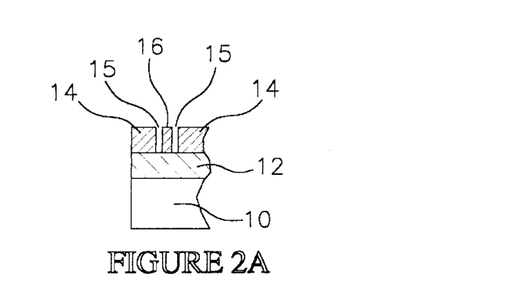
FIG. 2A is a cross sectional view taken along section line 2A—2A of FIG. 2.
Figure 2B:
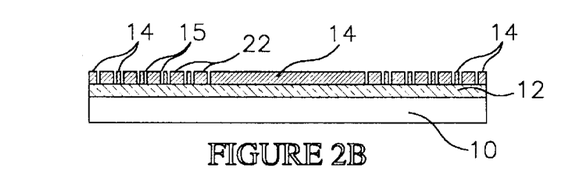
FIG. 2B is a cross sectional view taken along section line 2B—2B of FIG. 2.
Figure 2C:
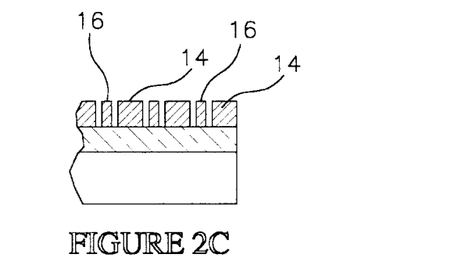
FIG. 2C is a cross sectional view taken along section line 2C—2C of FIG. 2.

Referring to FIG. 2, after providing the substrate 10 with the conductive layer 14 thereon, a pattern of conductors 16 can be formed on the substrate 10, by vaporizing portions of the conductive layer 14 using a laser to form grooves 15. FIG. 2A illustrates a single conductor 16 which is defined by grooves 15 on either side. FIG. 2C illustrates adjacent conductors 16 separated by a portion of the conductive layer 14. As shown in FIGS. 2A and 2C, the grooves 15 extend completely through the conductive layer 14 to the insulating layer 12. If the insulating layer 12 is omitted, the grooves 15 extend through the conductive layer 14 to a surface of the substrate 10. In addition, the conductors 16 are electrically isolated from one another, and from a remainder of the conductive layer 14, by the grooves 15.

The laser machining process is a subtractive process in that the grooves 15 are formed as portions of the conductive layer 14 are vaporized by a pulse of laser energy. Preferably, the laser machining process is controlled to form the grooves 15 in the conductive layer 14 without harming the insulating layer 12, or the substrate 10.

In the embodiment illustrated in FIG. 2, the conductors 16 include bond pads 18. As shown in FIG. 2E, the bond pads 18 can be bonded to solder bumps 26 on a semiconductor die 20 to form a chip module 24. Alternately the bond pads 18 can be adapted for wire bonding to the die 20. To facilitate bonding, following the laser machining process, the bond pads 18 can be plated with a solder wettable or wire bondable metal. In addition to the bond pads 18, the conductors 16 can include contact pads 22 adapted for electrical connection to outside circuitry, such as control or test circuitry for the chip module 24. As shown in FIG. 2B, the contact pads 22 are separated by portions of the conductive layer 14.

Figure 2D:
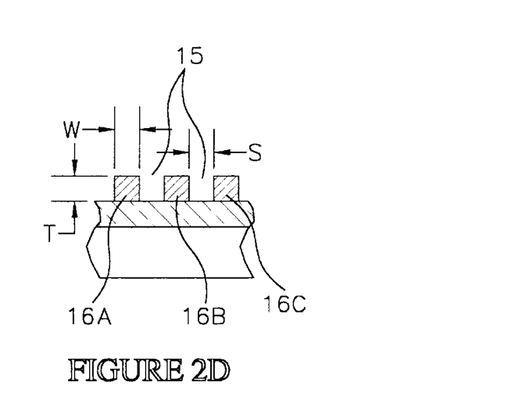
FIG. 2D is a cross sectional view equivalent to FIG. 2C illustrating alternate embodiment impedance matched conductors.
Figure 2E:
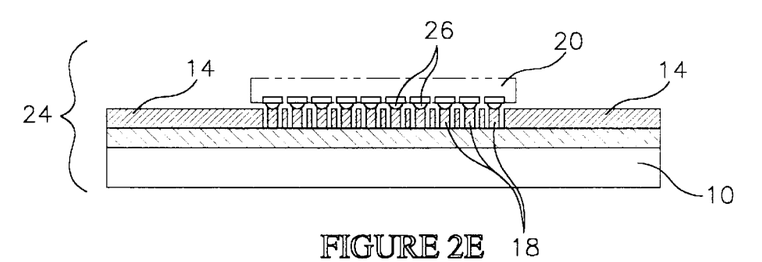
FIG. 2E is a cross sectional view taken along section line 2E—2E of FIG. 2 and also illustrating a semiconductor die in phantom forming a chip module.

FIG. 2D illustrates alternate embodiment conductors 16A, 16B, 16C that are configured with desired impedance values. Using the laser machining process, the conductors 16A, 16B, 16C can be formed with a relatively small width W and spacing S (where S is equal to the width of a groove 15). A representative width W and spacing S can be as small as about 5 $\mu$m. In addition to the width W and spacing S being extremely small, precise dimensional tolerances for these features can be maintained. Also, a thickness T of the conductors 16A, 16B, 16C can be precisely controlled during formation of the conductive layer 14. The size, spacing, thickness, and precise dimensional tolerances, allow conductors 16A and 16C to be configured as signal paths, and conductor 16B to configured as a path to ground or voltage. This permits an impedance of the signal conductors 16A, 16C to be matched, as required, to provide impedance matched components. In addition, the ground or voltage conductor 16B is co-planar to the signal conductors 16A, 16C, such that additional insulating layers are not required, and precise impedance values can be achieved by proper selection of the width, spacing and thickness dimensions.

Figure 3:
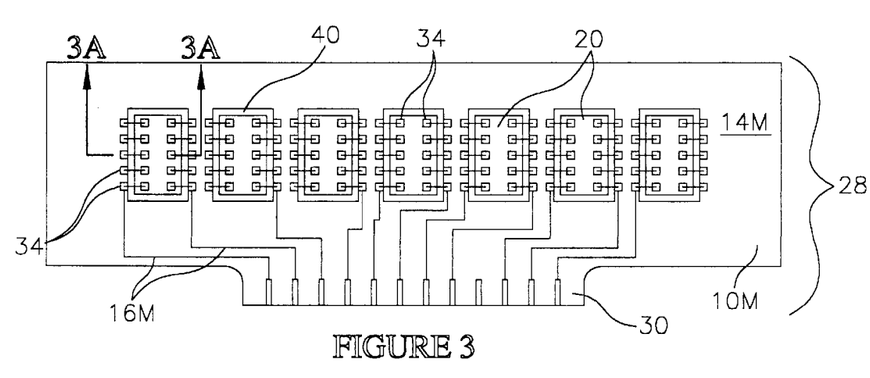
FIG. 3 is a plan view of a multi chip module fabricated using the method of the invention.
Figure 3A:
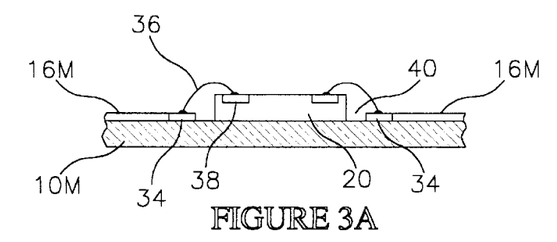
FIG. 3A is a cross sectional view taken along section line 3A—3A of FIG. 3 illustrating a die wire bonded to the multi chip module.

Referring to FIGS. 3 and 3A, an alternate embodiment semiconductor component in the form of a multi chip module 28 is shown. The multi chip module 28 includes a substrate 10M on which conductors 16M have been formed by laser machining grooves 15 in a conductive layer 14M, substantially as previously described for conductors 16 (FIG. 2). For simplicity an abbreviated pattern of conductors 16M is illustrated. In this embodiment, the conductors 16M are in electrical communication with an edge connector 30 on the substrate 10M. The edge connector 30 allows the multi chip module 28 to be electrically connected to external test or control circuitry (not shown).

The multi chip module 28 also includes openings 40 that are laser machined in the conductive layer 14M. A plurality of semiconductor dice 20 are mounted within the openings 40 and on the surface of the substrate 10M. As shown in FIG. 3A, the conductors 16M include bonding pads 34 for bonding wires 36 thereto and to bond pads 38 on the dice 20.

Figure 4:
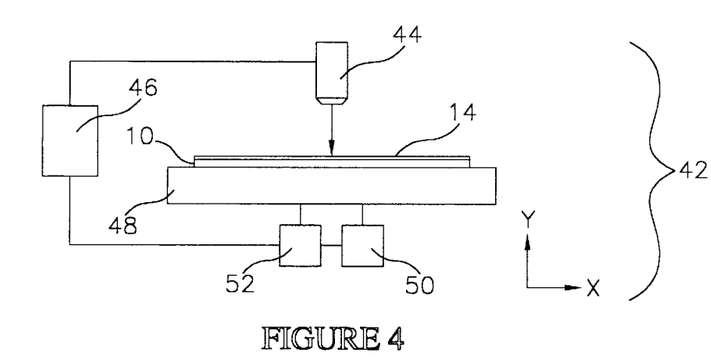
FIG. 4 is a schematic view of a laser system for performing the method of the invention.

Referring to FIG. 4, a laser system 42 for performing the method of the invention is illustrated. The laser system 42 includes a laser 44, and a computer controller 46 for the laser 44. In addition, the laser system 42 includes a base 48 adapted to support the substrate 10 for movement in X and Y directions. An X-axis driver 50, in signal communication with the computer controller 46, drives the base 48 in the X-direction. A Y-axis driver 52 in signal communication with the computer controller 46, drives the base 48 in the Y-direction.

A suitable laser system 42 is manufactured by General Scanning of Sommerville, Mass. and is designated as Model No. 670-W. A representative laser fluence for forming the grooves 15 (FIG. 2) in a conductive layer 14 comprising copper having a thickness of about 18 $\mu$m, is from 2 to 10 watts at a pulse duration of 20–25 ns and at a repetition rate of up to several thousand per second.

Figure 5:
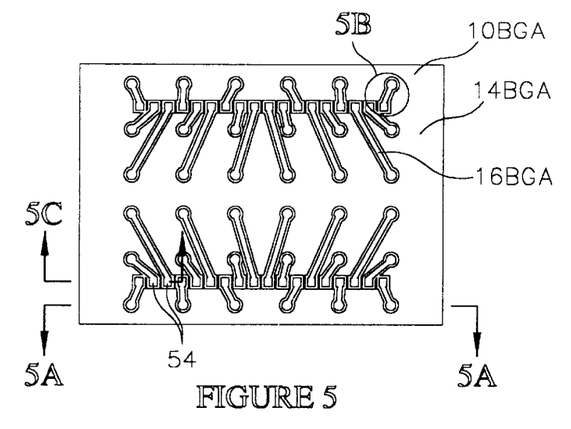
FIG. 5 is a plan view of a BGA substrate fabricated using the method of the invention.
Figure 5A:
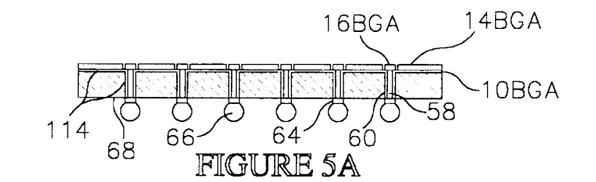
FIG. 5A is a cross sectional view taken along section line 5A—5A of FIG. 5.
Figure 5B:
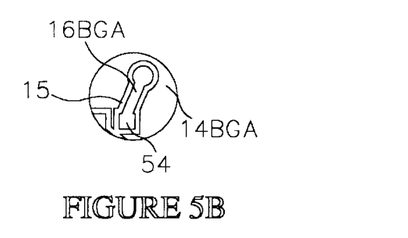
FIG. 5B is an enlarged portion of FIG. 5 taken along section line 5B—5B.
Figure 5C:
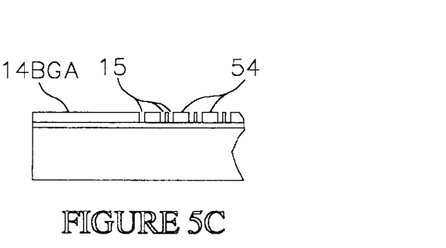
FIG. 5C is a cross sectional view taken along section line 5C—5C of FIG. 5.

Referring to FIGS. 5, 5A and 5B, a BGA substrate 10BGA fabricated using a laser machining process is illustrated. In this embodiment the BGA substrate 10BGA comprises monocrystalline silicon. However, other materials such as plastic, glass filled resin, or ceramic can be employed. The BGA substrate 10BGA includes a conductive layer 14BGA having a pattern of conductors 16BGA formed thereon by laser machining grooves 15 (FIG. 5B) in the conductive layer 14BGA substantially as previously described.

Figure 6:
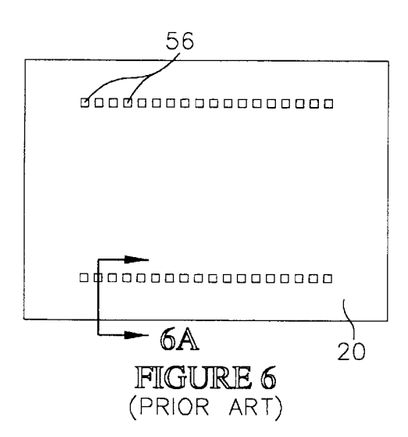
FIG. 6 is a plan view of a prior art semiconductor die.
Figure 6A:
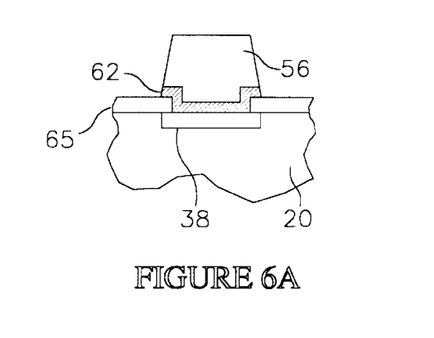
FIG. 6A is an enlarged cross sectional view taken along section line 6A—6A of FIG. 6 illustrating a bumped bond pad on the die.

As shown in FIG. 5B, each conductor 16BGA includes a pad 54. The pads 54 are adapted for flip chip mounting the semiconductor die 20 (FIG. 6) thereon. A size and pattern of the pads 54 on the conductors 16BGA matches a size and pattern of solder bumps 56 (FIGS. 6 and 6A) on the die 20. As shown in FIG. 6A, the solder bumps 56 are formed on the die bond pads 38 and die passivation layer 65 and can include an adhesion layer 62. Preferably the conductors 16BGA and pads 54 comprise a solder wettable metal such as copper. The pads 54 can also be covered with a solder wettable metal following the laser machining process, using a plating or deposition process.

As shown in FIG. 5A, the BGA substrate 10BGA also includes conductive vias 58 and external ball contacts 66 arranged in a ball grid array. Each conductor 16BGA is in electrical communication with a conductive via 58 and one or more ball contacts 66. The conductive vias 58 comprise openings 60 through the substrate 10BGA that include a conductive material, such as a metal, or a conductive polymer. On or more of the conductors 16BGA, and ball contacts 66 can be configured to provide co-planar impedance matching as previously described and shown in FIG. 2D.

One method for forming the conductive vias 58 is with a laser machining process. The previously identified Model No. 670-W laser machining apparatus manufactured by General Scanning of Sommerville, Mass. can be used to laser machine the openings 60 for the conductive vias 58. A representative diameter of the openings 60 for the conductive vias 58 can be from 10 $\mu$m to 2 mils or greater. A representative laser fluence for forming openings 60 through a substrate 10BGA formed of silicon and having a thickness of about 0.028-in (0.711 mm) is from 2 to 10 watts/per opening at a pulse duration of 20–25 ns and at a repetition rate of up to several thousand per second. With the substrate 10BGA comprising silicon the laser machined openings 60 can also be etched with a wet etchant such as KOH or TMAH. Etching enlarges and cleans the laser machined openings 60.

Rather than forming the openings 60 by laser machining, an etching process can be employed. In this case an etch mask (not shown) can be formed on the substrate 10BGA, and the substrate 10BGA etched through openings in the mask using a wet etchant. Suitable wet etchants with the substrate 10BGA comprising silicon include KOH and TMAH.

The conductive vias 58 can include a metal deposited within the openings 60 using a deposition process, such as CVD, electrolytic deposition or electroless deposition. Suitable metals include copper, aluminum, titanium, nickel, iridium, gold, tungsten, silver, platinum, palladium, tantalum, molybdenum or alloys of these metals. As another alternative, solder can be screen printed in the openings 60, as well as with capillary action, or with a vacuum system using a molten solder wave. In addition, the openings 60 can be completely filled with metal, or alternately just the inside surfaces or sidewalls of the openings 60 can be covered.

Rather than a metal, the conductive vias 58 can include a conductive polymer, such as a metal filled silicone, or an isotropic epoxy. Suitable conductive polymers are sold by A.I. Technology, Trenton, N.J.; Sheldahl, Northfield, Minn.; and 3M, St. Paul, Minn. A conductive polymer can be deposited within the openings 60, as a viscous material, and then cured as required. A suitable deposition process, such as screen printing, or stenciling, can be used to deposit the conductive polymer into the openings.

With the substrate 10BGA comprising silicon, electrically insulating layers 114 can be formed on the surface of the substrate 10BGA, and within the openings 60, for electrically insulating the conductors 16BGA, and conductive vias 58, from a bulk of the substrate 10BGA. The insulating layers 114 are preferably formed prior to formation of the conductive layer 14BGA, and prior to deposition of the conductive material within the openings 60. The insulating layers 114 can comprise a deposited material such as $SiO_2$, or an insulating polymer, such as polyimide.

Referring to FIG. 5A, the conductive vias 58 also include pads 64 formed on a back side 68 of the substrate 10BGA. The pads 64 can have a circular, square, rectangular or other peripheral configuration. The pads 64 can be formed during formation of the conductive vias 58 using a suitable mask (not shown), such as a hard mask, or a stencil mask. For example, a metal can be blanket deposited on the back side 68 of the substrate 10BGA and into the openings 58 and then etched to form the pads 64. Alternately the pads 64 can comprise a different material than the conductive vias 58, and can be formed using a separate deposition process.

The contact balls 66 can be formed on the pads 64 in electrical communication with the conductive vias 58 and conductors 16BGA. The contact balls 66 provide connection points for making electrical connections from the outside to the conductive vias 58 and conductors 16BGA. If the contact balls 66 are not provided on the pads 64, the electrical connections from the outside can be made directly to the pads 64.

For reflow applications, the contact balls 66 can comprise a solder alloy such as 95% Pb/5% Sn, 60% Pb/40% Sn, 63% In/37% Sn, or 62% Pb/36% Sn/2% Ag. The contact balls 66 can also be a conductive polymer such as an isotropic or anisotropic adhesive. The contact balls 66 can also comprise a base metal, such as Cu or Ni, and an outer layer formed of a non-oxidizing metal such as Au, Ag or Pd. A representative diameter for the contact balls 66 can be from about 4 mils to 50 mils or more. A pitch of the contact balls 66 can be from about 6 mils to 50 mils or more.

One method for attaching the contact balls 66 to the pads 64 is by bonding pre-fabricated metal balls to the pads 64. For example, pre-fabricated metal balls are manufactured by Mitsui Comtek Corp. of Saratoga, Calif. under the trademark "SENJU SPARKLE BALLS". The metal balls can be attached to the pads 64 by soldering, laser reflow, brazing, welding, or applying a conductive adhesive. A solder ball bumper can also be used to bond the contact balls 66 to the pads 64. A suitable solder ball bumper is manufactured by Pac Tech Packaging Technologies of Falkensee, Germany. The contact balls 66 can also be formed on the pads 64 using a conventional wire bonder apparatus adapted to form a ball bond, and then to sever the attached wire. The contact balls 66 can also be formed by electrolytic or electroless deposition of a metal to form bumps.

Figure 7:
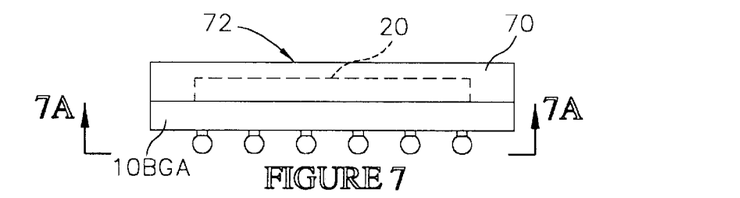
FIG. 7 is a side elevation view of a chip scale package fabricated using the BGA substrate of FIG. 5.
Figure 7A:
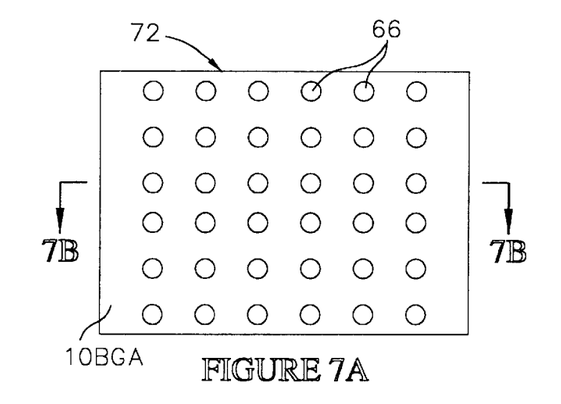
FIG. 7A is a bottom view of the package taken along line 7A—7A of FIG. 7.
Figure 7B:
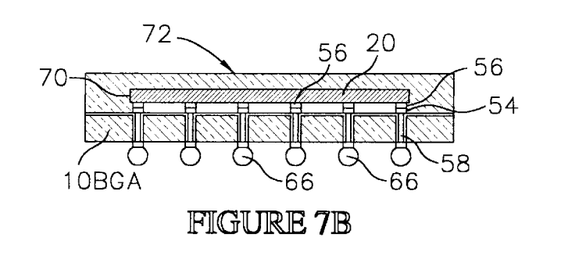
FIG. 7B is a cross sectional view of the package taken along section line 7B—7B of FIG. 7A.

Referring to FIGS. 7–7B, a semiconductor package 72 constructed with the BGA substrate 10BGA is illustrated. The package 72 includes the substrate 10BGA, a semiconductor die 20 flip chip mounted to the substrate 10BGA, and an encapsulant 70 covering the die 20, and face of the substrate 10BGA.

As shown in FIG. 7B, solder bumps 56 on the die 20 are bonded to the pads 54 on the conductors 16BGA of the substrate 10BGA. A reflow process can be used to bond the bumps 56 to the pads 54.

The encapsulant 70 can comprise an epoxy, silicone, room temperature vulcanizing (RTV), or polyimide material. Suitable encapsulants are commercially available from Dexter/Hysol under the trademark "HYSOL 4450", and from Thermoset under the trademark of "EP-729. The encapsulant 70 can be formed by dispensing a viscous encapsulant into a mold placed over the BGA substrate 10BGA, and then curing the viscous material.

Figure 8:
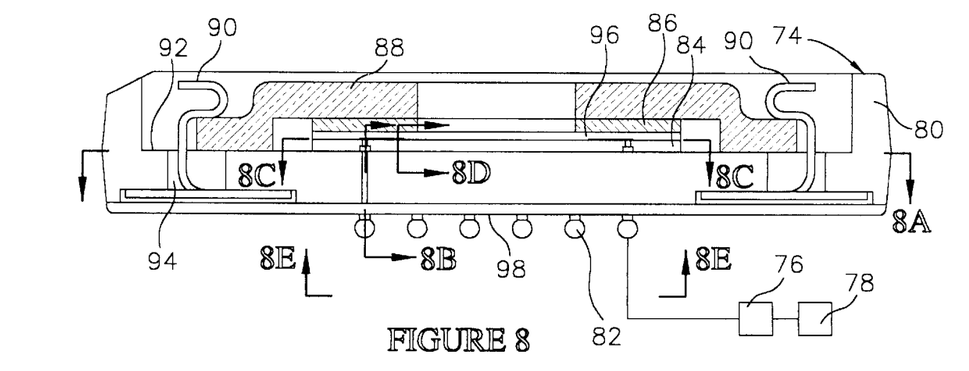
FIG. 8 is a cross sectional view of a test carrier having laser machined conductors formed using the method of the invention.
Figure 8A:
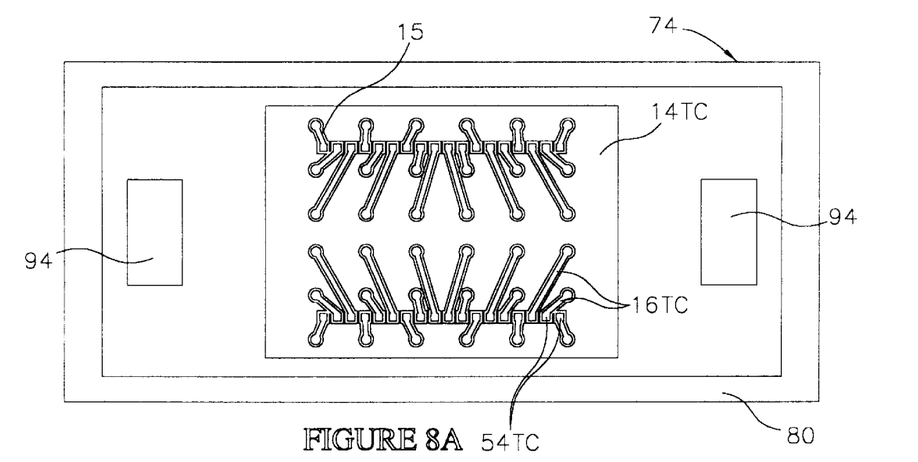
FIG. 8A is a cross sectional view taken along section line 8A—8A of FIG. 8 illustrating a surface of a base of the test carrier having the laser machined conductors thereon.
Figures 8B, 8C:
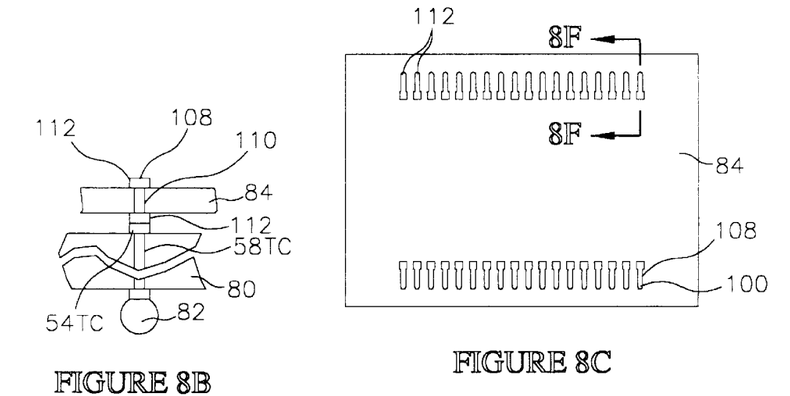
FIG. 8B is an enlarged cross sectional view taken along section line 8B—8B of FIG. 8 illustrating an interconnect of the test carrier bonded to the laser machined conductors on the base.
FIG. 8C is a cross sectional view taken along section line 8C—8C of FIG. 8 illustrating a surface of the interconnect.
Figure 8D:
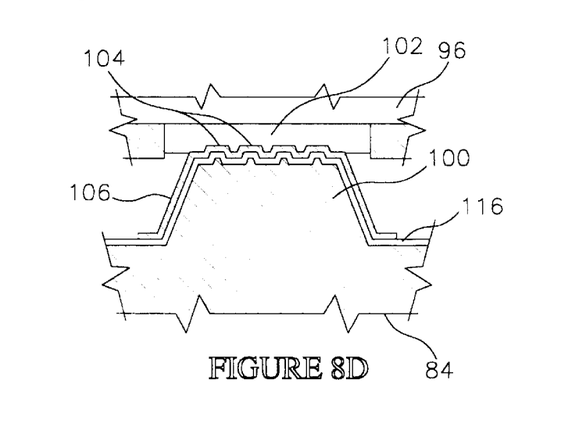
FIG. 8D is an enlarged cross sectional view taken along section line 8D—8D of FIG. 8 illustrating a contact on the interconnect electrically engaging a contact on the component.
Figure 8E:
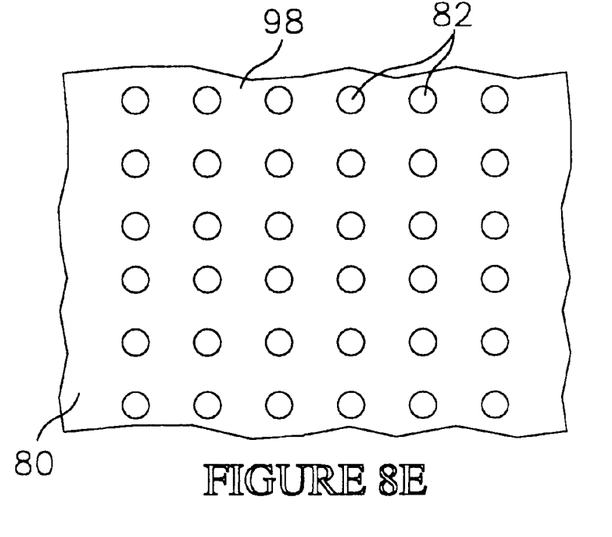
FIG. 8E is a bottom view taken along line 8E—8E of FIG. 8 illustrating external ball contacts on the test carrier.

Referring to FIGS. 8–8E, a test carrier 74 constructed using a laser machining process in accordance with the invention is illustrated. The test carrier 74 is adapted for testing a semiconductor component 96. As such, the carrier 74 includes an interconnect 84 adapted to establish temporary electrical communication with the component 96. Features of the interconnect 84 will be hereinafter described.

The component 96 can comprise an unpackaged die (e.g., die 20-FIG. 6) or a chip scale package (e.g., package 72-FIG. 7). For testing the component 96, the carrier 74 is configured for electrical connection to a burn-in board 76 (FIG. 8). The burn-in board 76 is in electrical communication with test circuitry 78 (FIG. 8) configured to apply test signals through the carrier 74 to the component 20A.

In addition to the interconnect 84, the carrier 74 includes a base 80 having a pattern of conductors 16TC formed thereon using the previously described laser machining process. In this embodiment a conductive layer 14TC can be deposited, or attached, to a surface 118 of the base 80 and grooves 15 laser machined in the conductive layer 14TC to define the conductors 16TC. The conductors 16TC include bonding pads 54TC configured for electrical communication with solder pads 112 (FIG. 8C) on the interconnect 84.

The base 80 also includes conductive vias 58TC in electrical communication with the conductors 16TC and with external ball contacts 82. As shown in FIG. 8E, the ball contacts 82 are formed on a surface 98 of the base 80 in a ball grid array. One or more of the conductors 16TC and associated ball contacts 82, can be configured to provide impedance matching for selected conductors 16TC configured as signal traces, as previously described.

In addition, the ball contacts 82 are configured for electrical connection to corresponding electrical connectors, such as clips or socket contacts, on the burn-in board 76. The base 80 can be fabricated with conductive vias 58TC, and ball contacts 82 substantially as described in U.S. patent application Ser. No. 08/726,349 entitled "Temporary Semiconductor Package Having Hard Metal, Dense Array Ball Contacts And Method Of Fabrication", which is incorporated herein by reference.

The test carrier 74 also includes a force applying mechanism comprising a spring 86 and a cover 88. The carrier base 80 includes a recess 92 wherein the spring 86 and cover 88 are mounted. In addition, the carrier 74 includes clips 90 that mate with openings 94 on the base 80, and secure the cover 88 to the base 80.

In the assembled carrier 74, the cover 88 and the spring 86 bias the component 96 against the interconnect 84. Assembly of the carrier 74 with the component 96 therein can be accomplished as described in U.S. Pat. No. 5,634,267 entitled "Method And Apparatus For Manufacturing Known Good Semiconductor Die", which is incorporated herein by reference.

Figure 8F:
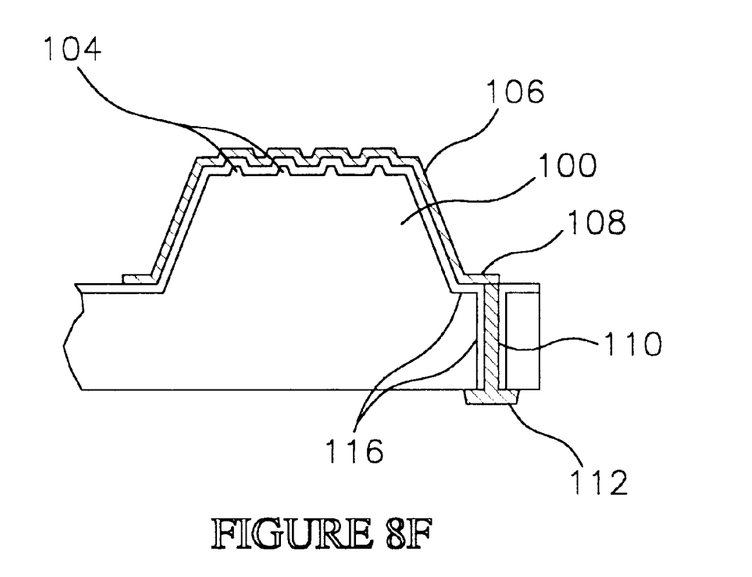
FIG. 8F is an enlarged cross sectional view taken along section line 8F—8F of FIG. 8C illustrating contacts on the interconnect.

Referring to FIGS. 8C, 8D and 8F, features of the interconnect 84 are shown. The interconnect 84 includes contacts 100 configured to electrically engage contacts 102 (FIG. 8D) on the component 96. The contacts 100 on the interconnect 84 include penetrating projections 104 covered with conductive layers 106. The conductive layers 106 are in electrical communication with conductors 108 (FIG. 8C) on the interconnect 84, and with conductive vias 110 (FIG. 8F) through the interconnect 84. In addition, an insulating layer 116 electrically isolates the conductive layers 106 and conductors 108 from the bulk of the interconnect 84. The insulating layer 116 also covers exposed surfaces of the interconnect 84 including the surfaces that may touch the conductors 16TC and conductive layer 14TC in the assembled test carrier 74.

As shown in FIG. 8F, the conductive vias 110 through the base 110 include solder pads 112. As shown in FIG. 8B, the solder pads 112 can be reflow bonded to the pads 54TC on the carrier base 80 to establish electrical communication between the external ball contacts 82 and interconnect contacts 100.

The interconnect 84 can be constructed substantially as disclosed in U.S. Pat. No. 5,686,317 entitled "Method For Forming An Interconnect Having A Penetration Limited Contact Structure For Establishing A Temporary Electrical Connection With A Semiconductor Die", which is incorporated herein by reference. U.S. patent application Ser. No. 08/993,965 entitled "Semiconductor Interconnect Having Laser Machined Contacts", which is incorporated herein by reference, also describes a method for fabricating the interconnect 84.

Thus the invention provides an improved method for fabricating semiconductor components such as printed circuit boards, multi chip modules, chip scale packages and test carriers for semiconductor components.

Although the invention has been described with reference to certain preferred embodiments, as will be apparent to those skilled in the art, certain changes and modifications can be made without departing from the scope of the invention as defined by the following claims.

We claim:

1. A method for fabricating a semiconductor component comprising:

providing a substrate comprising a surface and a conductive layer on the surface;

laser machining a plurality of grooves through the conductive layer to the surface to define a plurality of conductors on the surface and a plurality of pads on the surface in electrical communication with the conductors, each conductor and each pad comprising a portion of the conductive layer with a groove on either side thereof; and mounting a semiconductor die to the substrate in electrical communication with the pads.

2. The method of claim 1 further comprising forming a plurality of conductive vias in the substrate in electrical communication with the conductors and the pads.

3. The method of claim 1 further comprising forming a plurality of contacts on an opposing second surface of the substrate in electrical communication with the conductors and the pads.

4. A method for fabricating a semiconductor component comprising:

providing a substrate comprising a first surface, an opposing second surface, and a conductive layer on the first surface;

laser machining a plurality of grooves through the conductive layer to the surface to define a plurality of conductors on the surface, each conductor comprising a portion of the conductive layer with a groove on either side thereof;

laser machining a plurality of vias in the substrate in electrical communication with the conductors, each via extending from the first surface to the second surface;

depositing a conductive material in the vias to form a plurality of conductive vias; and forming a plurality of contacts on the second surface in electrical communication with the conductive vias.

5. The method of claim 4 further comprising mounting a semiconductor die to the substrate in electrical communication with the conductors.

6. The method of claim 4 wherein the substrate comprises a material selected from the group consisting of silicon, plastic, glass filled resin, and ceramic.

7. The method of claim 4 wherein the conductive material comprises a metal or a conductive polymer.

8. A method for fabricating a semiconductor component comprising:

providing a substrate comprising a surface and a conductive layer on the surface;

laser machining a plurality of grooves through the conductive layer to the surface to define a plurality of conductors on the surface, each conductor comprising a portion of the conductive layer with a groove on either side thereof;

laser machining a plurality of pads on the surface in electrical communication with the conductors; and mounting a semiconductor die to the substrate in electrical communication with the pads.

9. The method of claim 8 wherein the mounting step comprises wire bonding bond pads on the die to the pads.

10. The method of claim 8 wherein the mounting step comprises flip chip mounting the die to the pads.

11. A method for fabricating a semiconductor component comprising:

providing a substrate comprising a surface and a conductive layer on the surface having a thickness; and laser machining a plurality of grooves through the conductive layer to the surface to define a first conductor and a second conductor on the surface, the first conductor comprising a signal path for the component, the second conductor in electrical communication with a ground path or a voltage path, with the thickness of the conductive layer and a width of the grooves selected to provide an impedance value for the first conductor.

12. The method of claim 11 wherein the component comprises a chip module.

13. The method of claim 11 wherein the component comprises a package.

14. The method of claim 11 wherein the component comprises a test carrier for testing semiconductor components.

15. A method for fabricating a semiconductor component comprising:

providing a substrate comprising a surface and a conductive layer on the surface having a thickness;

laser machining a plurality of conductors in the conductive layer, each conductor defined by a pair of grooves through the conductive layer, the conductors comprising a plurality of first pads;

mounting a semiconductor die comprising a plurality second pads to the substrate by bonding the second pads to the first pads; and selecting the thickness of the conductive layer, and a width of the grooves, to provide an impedance for the conductors.

16. The method of claim 15 further comprising forming a plurality of contacts on the substrate in electrical communication with the conductors.

17. The method of claim 16 wherein the contacts comprise balls in a ball grid array.

18. The method of claim of claim 16 further comprising forming a plurality of conductive vias through the substrate in electrical communication with the conductors and with the contacts.

19. The method of claim 18 wherein forming the conductive vias comprises laser machining openings in the substrate and at least partially filling the openings with a conductive material.

20. The method of claim 15 wherein the substrate comprises a material selected from the group consisting of silicon, plastic, glass filled resin, and ceramic.

21. A method for fabricating a semiconductor component comprising:

providing a substrate comprising a first surface, an opposing second surface, and a conductive layer on the first surface;

laser machining a plurality of grooves through the conductive layer to the first surface to define a plurality of conductors on the first surface, each conductor comprising a portion of the conductive layer with a groove on either side thereof;

forming a plurality of conductive vias in the substrate in electrical communication with the conductors, each conductive via extending from the first surface to the second surface;

forming a plurality of contacts on the second surface in electrical communication with the conductive vias; and mounting a semiconductor die to the first surface in electrical communication with the conductors.

22. The method of claim 21 further comprising at least partially encapsulating the die by depositing an encapsulant on the first surface.

23. The method of claim 21 wherein the contacts comprise balls in a ball grid array.

24. The method of claim 21 wherein the component comprises a package.

* * * * *